(12) United States Patent
Man et al.

(10) Patent No.: US 8,642,980 B2
(45) Date of Patent: Feb. 4, 2014

(54) COMPOSITE CHARGED PARTICLE BEAM APPARATUS

(71) Applicant: Hitachi High-Tech Science Corporation, Tokyo (JP)

(72) Inventors: Xin Man, Tokyo (JP); Yo Yamamoto, Tokyo (JP); Atsushi Uemoto, Tokyo (JP); Tatsuya Asahata, Tokyo (JP)

(73) Assignee: Hitachi High-Tech Science Corporation (JP)

( * ) Notice: Subject to any disclaimer, the term of this patent is extended or adjusted under 35 U.S.C. 154(b) by 0 days.

(21) Appl. No.: 13/840,311

(22) Filed: Mar. 15, 2013

(65) Prior Publication Data
US 2013/0248735 A1    Sep. 26, 2013

(30) Foreign Application Priority Data

Mar. 22, 2012 (JP) ................. 2012-066005

(51) Int. Cl.
*G01N 23/225* (2006.01)
*H01J 37/26* (2006.01)
*H01J 37/317* (2006.01)

(52) U.S. Cl.
USPC ...... 250/492.21; 250/306; 250/307; 250/309; 250/311; 250/492.3

(58) Field of Classification Search
USPC .......... 250/306, 307, 309, 311, 492.21, 492.3
See application file for complete search history.

(56) References Cited

U.S. PATENT DOCUMENTS

| | | | | |
|---|---|---|---|---|
| 5,986,264 | A * | 11/1999 | Grunewald | 250/310 |
| 6,927,391 | B2 * | 8/2005 | Tokuda et al. | 850/10 |
| 7,550,750 | B2 * | 6/2009 | Tokuda et al. | 250/492.21 |
| 7,718,981 | B2 * | 5/2010 | Takahashi et al. | 250/492.21 |
| 8,269,188 | B2 * | 9/2012 | Ogawa | 250/396 R |
| 8,274,049 | B2 * | 9/2012 | Tanaka et al. | 250/311 |
| 2009/0119807 | A1 * | 5/2009 | Man et al. | 850/18 |
| 2011/0186734 | A1 * | 8/2011 | Hasuda et al. | 250/307 |
| 2011/0226947 | A1 * | 9/2011 | Takahashi et al. | 250/307 |
| 2011/0226948 | A1 * | 9/2011 | Tanaka et al. | 250/307 |
| 2013/0241091 | A1 * | 9/2013 | Man | 264/1.36 |

FOREIGN PATENT DOCUMENTS

JP    2011196802    10/2011

* cited by examiner

*Primary Examiner* — David A Vanore
(74) *Attorney, Agent, or Firm* — Adams & Wilks

(57) ABSTRACT

Provided is a composite charged particle beam apparatus, including: an electron beam column for irradiating a sample with an electron beam; an ion beam column for irradiating the sample with an ion beam to perform etching processing; a sample stage drive portion for moving a sample stage in an irradiation axis direction of the electron beam; and a column adjusting portion for moving the ion beam column relatively to a sample chamber such that the sample is irradiated with the ion beam at a position irradiated with the electron beam.

6 Claims, 3 Drawing Sheets

COMPOSITE CHARGED PARTICLE BEAM APPARATUS

This application claims priority from Japanese Patent Application No. 2012-066005 filed on Mar. 22, 2012, the entire subject-matter of which is incorporated herein by reference.

BACKGROUND OF THE INVENTION

1. Field of the Invention

The present invention relates to a composite charged particle beam apparatus for irradiating a sample with at least two charged particle beams.

2. Description of the Related Art

A FIB-SEM composite apparatus is known as an apparatus for observing, through a scanning electron microscope, a cross-section subjected to etching processing by focused ion beam irradiation.

In SEM observation, in general, when an observation surface is observed from a direction perpendicular thereto, observation can be performed with a high resolution. Then, there has been proposed a sample processing and observation method for SEM observation of a cross-section formed by FIB processing from a perpendicular direction with the use of a composite charged particle beam apparatus in which a FIB column and a SEM column are arranged at a right angle (see JP-A-2011-196802). According to this method, the cross-section cut out by fine processing by FIB can be observed by SEM with a high resolution in situ.

By the way, in SEM observation, in general, when a working distance (WD) as the distance between an objective lens and a sample surface becomes smaller, observation can be performed with a higher resolution. Therefore, the conventional apparatus has been designed so that the tip of the SEM column and a sample may be arranged as close as possible to each other.

However, if the tip of the SEM column and the sample are arranged close to each other, there have been problems in that the tip of the SEM column may interfere with the tip of an ion beam column or a gas nozzle for film formation as other components and that charged particles or X rays generated from the sample may be prevented from reaching a detector.

SUMMARY OF THE INVENTION

Illustrative aspects of the present invention provide a composite charged particle beam apparatus capable of changing a working distance (WD) depending on a purpose of observation.

According to one illustrative aspect of the present invention, there is provided a composite charged particle beam apparatus, including: a sample chamber; a sample stage configured to hold a sample; an electron beam column configured to irradiate the sample with an electron beam; an ion beam column configured to irradiate the sample with an ion beam to perform etching processing; a detector configured to detect a charged particle generated from the sample; an image forming portion configured to form a charged particle image based on a detection signal of the detector; a sample stage drive portion configured to move the sample stage in an irradiation axis direction of the electron beam; and a column adjusting portion for moving the ion beam column relatively to the sample chamber such that the sample is irradiated with the ion beam at a position irradiated with the electron beam.

With this configuration, the WD of the electron beam column can be changed by moving the sample stage and the ion beam column relatively to the sample chamber.

According to the composite charged particle beam apparatus of the present invention, a sample can be processed and observed while changing the WD of the electron beam column depending on the purpose of observation.

DETAILED DESCRIPTION

A composite charged particle beam apparatus according to an embodiment of the present invention will be described below.

Figure 1:
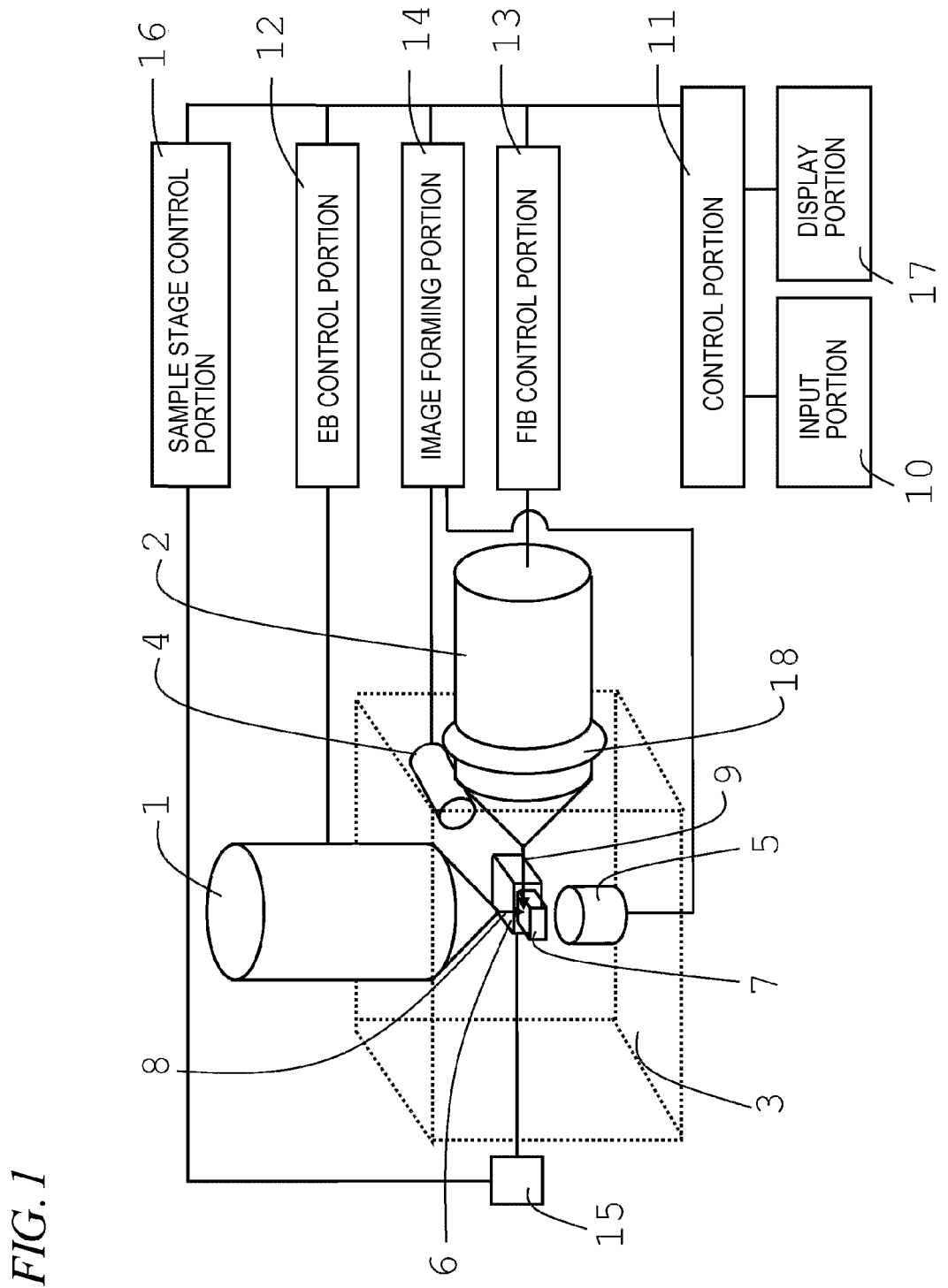
FIG. 1 is a configuration diagram of a composite charged particle beam apparatus according to an embodiment of the present invention.

As illustrated in FIG. 1, the composite charged particle beam apparatus includes an electron beam column 1, an ion beam column 2, and a sample chamber 3. The electron beam column 1 and the ion beam column 2 irradiate a sample 7 accommodated in the sample chamber 3 with an electron beam 8 and an ion beam 9, respectively. The electron beam column 1 and the ion beam column 2 are arranged such that irradiation axes thereof may be orthogonal to each other on the sample 7.

The charged particle beam apparatus further includes a secondary electron detector 4 and a transmission electron detector 5 as charged particle detectors. The secondary electron detector 4 is capable of detecting secondary electrons generated from the sample 7 by irradiation of the electron beam 8 or the ion beam 9. The transmission electron detector 5 is provided at a position opposed to the electron beam column 1. The transmission electron detector 5 is capable of detecting transmitted electrons that have transmitted through the sample 7 and the electron beam 8 that has not entered the sample 7 as a result of the irradiation of the electron beam 8 to the sample 7.

The charged particle beam apparatus further includes a sample stage 6 for holding the sample 7. The sample stage 6 is driven by a sample stage drive portion 15, and the movement of the sample stage 6 is controlled by a sample stage control portion 16.

The sample stage drive portion 15 moves the sample stage 6 in three axis directions of the X, Y, and Z directions. The charged particle beam apparatus is disposed such that an irradiation axis direction of the electron beam column 2 and the Z direction may be parallel to each other.

The charged particle beam apparatus further includes an EB control portion 12, a FIB control portion 13, an image forming portion 14, and a display portion 17. The EB control portion 12 transmits an irradiation signal to the electron beam column 1 to control the electron beam column 1 to radiate the electron beam 8. The FIB control portion 13 transmits an irradiation signal to the ion beam column 2 to control the ion beam column 2 to radiate the ion beam 9.

The image forming portion 14 forms a transmission electron image based on a signal for scanning the electron beam 8 sent from the EB control portion 12 and a signal of the transmission electrons detected by the transmission electron detector 5. The display portion 17 is capable of displaying the transmission electron image. The image forming portion 14 forms data of a SEM image based on the signal for scanning the electron beam 8 sent from the EB control portion 12 and a signal of the secondary electrons detected by the secondary electron detector 4. The display portion 17 is capable of displaying the SEM image. Further, the image forming portion 14 forms data of a SIM image based on a signal for scanning the ion beam 9 sent from the FIB control portion 13 and a signal of the secondary electrons detected by the secondary electron detector 4. The display portion 17 is capable of displaying the SIM image.

The charged particle beam apparatus further includes an input portion 10 and a control portion 11. An operator inputs conditions on the apparatus control to the input portion 10. The input portion 10 transmits the input information to the control portion 11. The control portion 11 transmits a control signal to the EB control portion 12, the FIB control portion 13, the image forming portion 14, the sample stage control portion 16, or the display portion 17, to thereby control the operation of the charged particle beam apparatus.

The charged particle beam apparatus further includes a working distance (WD) adjusting portion 18. The WD adjusting portion 18 moves the ion beam column 2 relatively to the sample chamber 3. That is, the ion beam column 2 is configured to be independently moved from the sample chamber 3 by the WD adjusting portion 18.

Figure 2A:
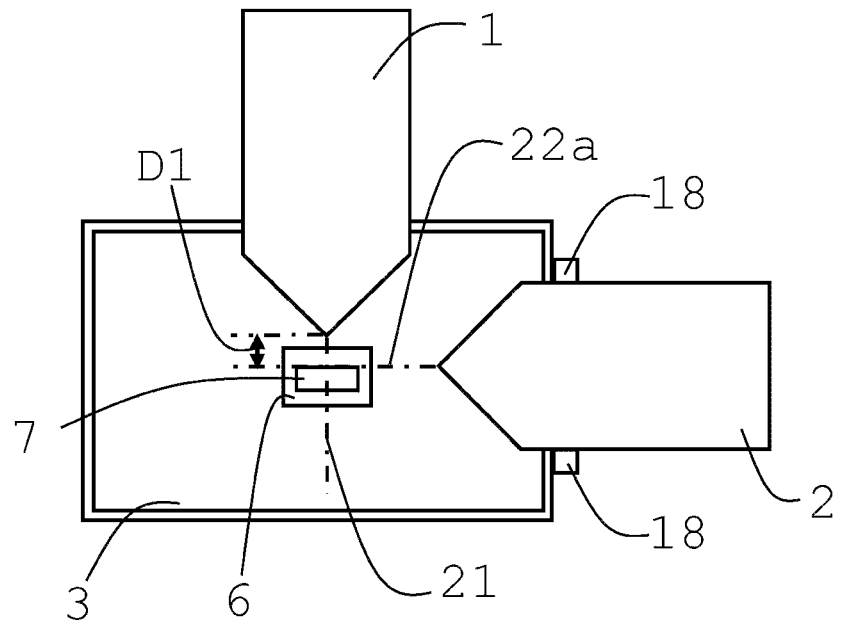
FIGS. 2A and 2B are explanatory diagrams of the composite charged particle beam apparatus according to the embodiment of the present invention.
Figure 2B:
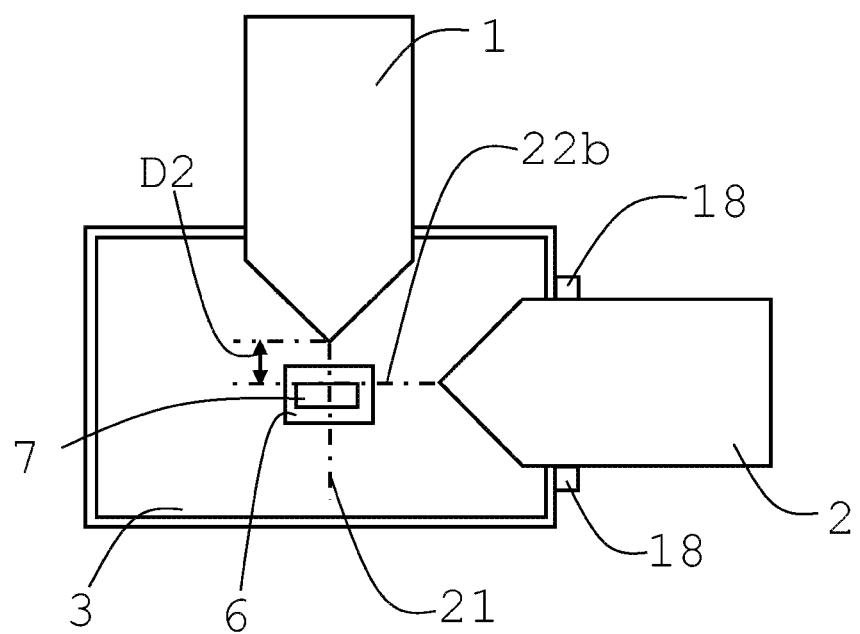

How to change the WD will be described with reference to FIGS. 2A and 2B. FIG. 2A is a diagram showing the state where the WD is short, and the sample 7 is disposed on the sample stage 6 such that an irradiation axis 21 of the electron beam column 1 and an irradiation axis 22a of the ion beam column 2 may be orthogonal to each other on the surface of the sample 7. The distance between the tip of the electron beam column 1 and the surface of the sample 7 in this case is represented by D1, and D1 is 2 mm. In this state, the sample 7 is irradiated with the ion beam 9 from the ion beam column 2, to thereby form a cross-section in the sample 7. The formed cross-section is scanned and irradiated with the electron beam 8 from the electron beam column 1, to thereby observe a SEM image of the cross-section. The cross-section is irradiated with the electron beam perpendicularly and the WD is short, and hence high resolution SEM observation can be performed.

Next, the WD is changed. Before the change, a SIM image of the sample stage 6 is first observed, and the position of the sample stage 6 on the SIM image is stored. Next, the sample stage 6 is moved by a desired increment (3 mm) of the WD of the electron beam column 1 along the irradiation direction of the electron beam 8, that is, along the Z axis. Next, while a SIM image is observed, the WD adjusting portion 18 is controlled to move the ion beam column 2 along the irradiation direction of the electron beam 8, that is, along the Z axis, such that the sample stage 6 on the SIM image may be displayed at the same position as the position before movement. Then, a SIM image of the sample stage 6 is observed, and the sample stage 6 is moved such that the sample stage 6 on the SIM image may be displayed at the same position as the position before movement. In this manner, the movement distance of the ion beam column 2 and the movement distance of the sample stage 6 become equal to each other. In other words, the irradiation axis 21 of the electron beam column 1 and the irradiation axis 22b of the ion beam column 2 are orthogonal to each other on the surface of the sample 7. FIG. 2B is a diagram in the state where the WD is long. A distance D2 between the tip of the electron beam column 1 and the surface of the sample 7 is 5 mm, which is larger than the distance D1. In this state, the cross-section formation by the ion beam 9 and the cross-section observation by the electron beam 8 can be performed. Further, the distance between the sample 7 and the tip of the electron beam column 2 is large, and hence the processing and observation can be performed in a manner that the sample 7 is tilted at such an angle that the sample 7 and the tip of the electron beam column 2 collide with each other when the WD is small. In addition, backscattered electrons or X-rays, which cannot be observed with a small WD, can be detected.

Figure 3A:
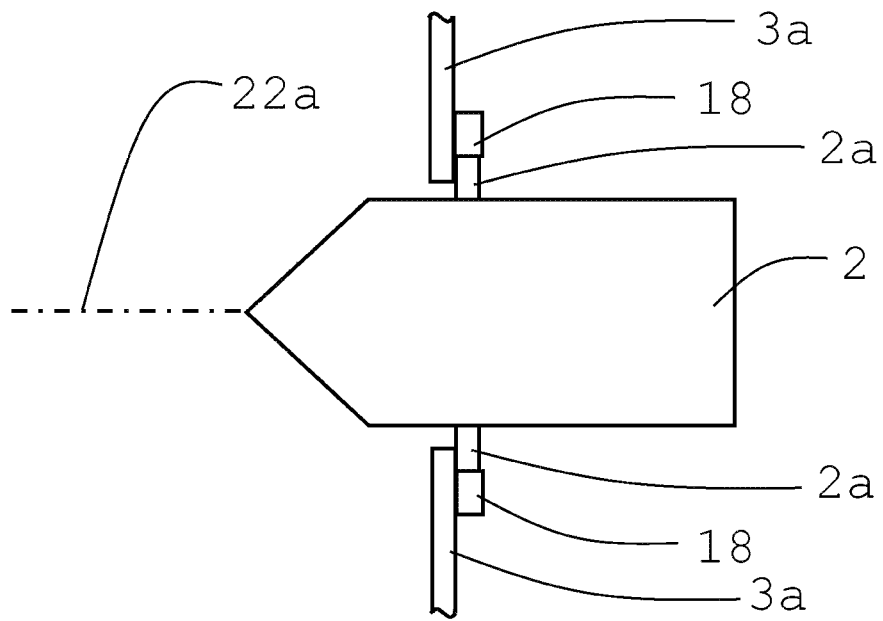
FIGS. 3A and 3B are further explanatory diagrams of the composite charged particle beam apparatus according to the embodiment of the present invention.

Now, referring to FIGS. 3A and 3B, the movement of the ion beam column 2 will be described. As illustrated in FIG. 3A, a wall surface 3a of the sample chamber 3 is provided with a port having a diameter larger than a diameter of the ion beam column 2, and the ion beam column 2 is connected to the sample chamber 3 via the port. The ion beam column 2 has a contact portion 2a held in contact with the wall surface 3a. A diameter of the contact portion 2a is larger than the diameter of the port. The wall surface 3a and the contact portion 2a are held in contact with each other to maintain a vacuum state of the sample chamber 3. The WD adjusting portion 18 translates the contact portion 2a while maintaining the contact state between the contact portion 2a and the wall surface 3a, to thereby move the ion beam column 2. As the WD adjusting portion 18, for example, an O-ring for vacuum sealing can be used.

Figure 3B:
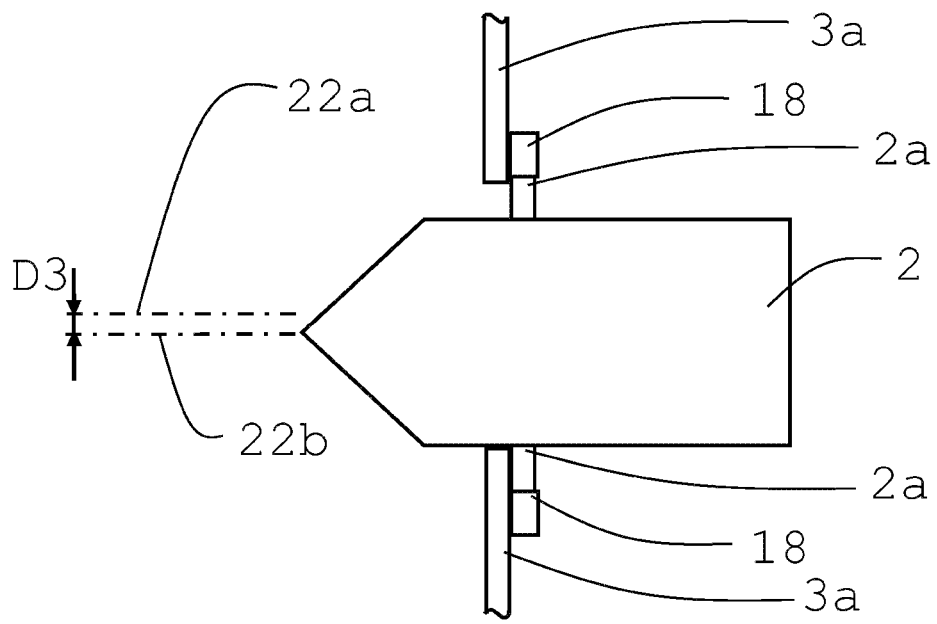

FIG. 3B is a diagram after the movement. The ion beam column 2 is moved by being pushed by the WD adjusting portion 18. The ion beam column 2 can be moved within the range of the diameter of the port of the wall surface 3a. The wall surface 3a and the contact portion 2a are always held in contact with each other, and hence an inside of the sample chamber 3 can be maintained to be in the vacuum state. In this manner, the ion beam column 2 is moved by a distance D3 between the irradiation axis 22a of the ion beam column 2 before movement and the irradiation axis 22b of the ion beam column 2 after movement.

In the above description, the irradiation axis of the ion beam column 2 is disposed so as to be orthogonal to the irradiation axis of the electron beam column 1. However, the same action and effect are obtained even when the axes are not orthogonal to each other.

What is claimed is:

1. A composite charged particle beam apparatus, comprising:
   a sample chamber;
   a sample stage configured to hold a sample;
   an electron beam column configured to irradiate the sample with an electron beam;
   an ion beam column configured to irradiate the sample with an ion beam to perform etching processing;
   a detector configured to detect a charged particle generated from the sample;
   an image forming portion configured to form a charged particle image based on a detection signal of the detector;
   a sample stage drive portion configured to move the sample stage in an irradiation axis direction of the electron beam; and
   a column adjusting portion configured to move the ion beam column relatively to the sample chamber such that the sample is irradiated with the ion beam at a position irradiated with the electron beam.

2. The composite charged particle beam apparatus according to claim 1, wherein the sample chamber comprises a port having a diameter larger than a diameter of the ion beam column, and wherein the column adjusting portion is configured to move the ion beam column within a range of the diameter of the port.

3. The composite charged particle beam according to claim 2, wherein the ion beam column comprises a contact portion having a diameter larger than the diameter of the port and configured to contact a wall surface of the sample chamber to maintain a vacuum state of the sample chamber.

4. The composite charged particle beam according to claim 3, wherein the column adjusting portion is configured to translate the contact portion 2a to move the ion beam column while maintaining a contact state between the contact portion and the wall surface.

5. The composite charged particle beam apparatus according to claim 1, wherein the ion beam column has an irradiation axis orthogonal to an irradiation axis of the electron beam column on the sample, and wherein the column adjusting portion is configured to move the ion beam column in a direction parallel to an irradiation direction of the electron beam.

6. The composite charged particle beam apparatus according to claim 1, further comprising:

a control portion configured to:
control the column adjusting portion to move the ion beam column; and
move the sample stage by the same amount as a movement amount of the ion beam column.

* * * * *